(12) United States Patent
Rodriguez et al.

(10) Patent No.: US 11,332,254 B2
(45) Date of Patent: May 17, 2022

(54) PYROTECHNIC ENERGY CONVERSION SYSTEM FOR EJECTION ASSEMBLY

(71) Applicant: GOODRICH CORPORATION, Charlotte, NC (US)

(72) Inventors: Jean C. Rodriguez, Vallejo, CA (US); Jerry A. Lambert, Dixon, CA (US)

(73) Assignee: Goodrich Corporation, Charlotte, NC (US)

( * ) Notice: Subject to any disclaimer, the term of this patent is extended or adjusted under 35 U.S.C. 154(b) by 367 days.

(21) Appl. No.: 16/715,475

(22) Filed: Dec. 16, 2019

(65) Prior Publication Data

US 2021/0179280 A1    Jun. 17, 2021

(51) Int. Cl.
*B64D 25/10* (2006.01)
*F42B 3/10* (2006.01)
*H05K 1/02* (2006.01)

(52) U.S. Cl.
CPC ............... *B64D 25/10* (2013.01); *F42B 3/10* (2013.01); *H05K 1/0201* (2013.01)

(58) Field of Classification Search
CPC ...... B64D 25/10; H01H 39/004; H01H 37/32; H05K 1/0201
See application file for complete search history.

(56) References Cited

U.S. PATENT DOCUMENTS

| | | | |
|---|---|---|---|
| 3,669,388 A * | 6/1972 | Van Kreuningen | B64D 25/00 244/138 R |
| 6,659,010 B2 | 12/2003 | Goernig et al. | |
| 7,652,868 B2 * | 1/2010 | Gaudinat | F42B 3/182 361/264 |
| 9,564,278 B2 * | 2/2017 | Harrington | H01H 37/04 |

FOREIGN PATENT DOCUMENTS

WO    2008098906    8/2008

* cited by examiner

*Primary Examiner* — Richard G Davis
(74) *Attorney, Agent, or Firm* — Snell & Wilmer L.L.P.

(57) ABSTRACT

An energy conversion system may comprise a substrate including a first conductive trace and a second conductive trace electrically isolated from the first conductive trace. A housing may be coupled to the substrate. An ignition compound may be located in the housing. A solder may be thermally coupled to the ignition compound such that ignition of the ignition compound melts the solder. The housing may be configured to output the solder onto the first conductive trace and the second conductive trace.

20 Claims, 4 Drawing Sheets

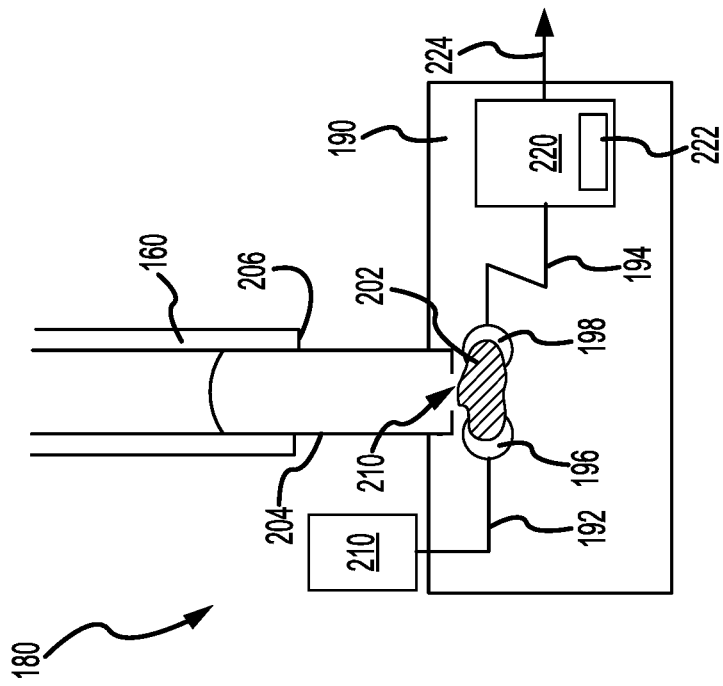
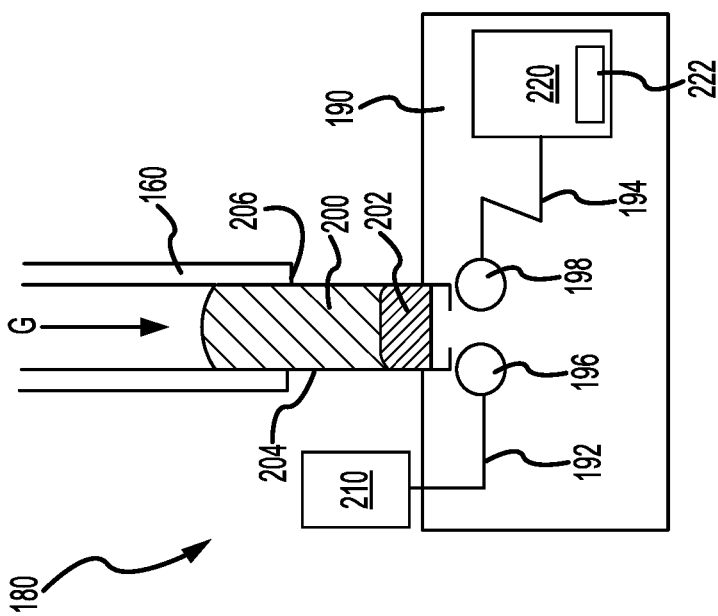
FIG.3A
FIG.3B

PYROTECHNIC ENERGY CONVERSION SYSTEM FOR EJECTION ASSEMBLY

FIELD

The present disclosure relates to energy conversion systems, and more specifically, to an energy conversion system configured to convert pyrotechnic energy to an electrical signal in an ejection assembly.

BACKGROUND

Ejection seats are designed to expel pilots from an aircraft. Deployment of the ejection seat and/or the ejection seat subsystems (e.g., parachute mortars, harness release thruster, etc.) may occur in response to a pyrotechnic event. For example, the time delay for deploying the ejection seat and/or one or more of the ejection seat subsystems may be controlled by firing pyrotechnic devices of varying time delays. It may be desirable to control the time delays via an electric signal. However, current ejection systems lack a system for converting a pyrotechnic signal into an electrical signal.

SUMMARY

An energy conversion system is disclosed herein. In accordance with various embodiments, the energy conversion system may comprise a substrate including a first conductive trace and a second conductive trace electrically isolated from the first conductive trace. A housing may be coupled to the substrate. An ignition compound may be located in the housing. A may be solder located in the housing.

In various embodiments, the ignition compound may comprise a thermite. In various embodiments, the solder may be thermally coupled to the ignition compound such that ignition of the ignition compound melts the solder. The housing may be configured to output the solder onto the first conductive trace and the second conductive trace.

In various embodiments, an orifice in the housing may be oriented toward the first conductive trace and the second conductive trace. In various embodiments, a first conductive pad may be electrically coupled to the first conductive trace, and a second conductive pad may be electrically coupled to the second conductive trace. The orifice in the housing may be oriented toward the first conductive pad and the second conductive pad.

In various embodiments, a power supply may be electrically coupled to the first conductive trace. In various embodiments, the power supply may be thermally coupled to the ignition compound.

An assembly is also disclosed herein. In accordance with various embodiments, the assembly may comprise a pyrotechnic input configured to undergo an exothermic chemical reaction and an energy conversion system operationally coupled to the pyrotechnic input. The energy conversion system may comprise a substrate including a first conductive trace and a second conductive trace electrically isolated from the first conductive trace, a housing coupled to the substrate and the pyrotechnic input, an ignition compound located in the housing and operationally coupled to the pyrotechnic input such that a combustion product of the exothermic chemical reaction of the pyrotechnic input ignites the ignition compound, and a solder thermally coupled to the ignition compound.

In various embodiments, the ignition compound may comprise a thermite. In various embodiments, the solder may be thermally coupled to the ignition compound such that ignition of the ignition compound melts the solder. The housing may be configured to output the solder onto the first conductive trace and the second conductive trace.

In various embodiments, an actuator may be configured to initiate the exothermic chemical reaction of the pyrotechnic input. In various embodiments, a power supply may be electrically coupled to the first conductive trace. In various embodiments, the power supply may be thermally coupled to the ignition compound.

In various embodiments, a controller may be electrically coupled to the second conductive trace. The controller may be configured to receive a first electrical signal from the second conductive trace and output a second electrical signal a predetermined time delay after receiving the first electrical signal.

An ejection assembly is also disclosed herein. In accordance with various embodiments, the ejection assembly may comprise an ejection seat, an ejection handle configured to initiate an ejection sequence for the ejection seat in response to an actuation of the ejection handle, a pyrotechnic input operationally coupled to the ejection handle, and an energy conversion system operationally coupled to the pyrotechnic input. Actuation of the ejection handle may be configured initiate an exothermic chemical reaction within the pyrotechnic input. The energy conversion system may comprise a substrate including a first conductive trace and a second conductive trace electrically isolated from the first conductive trace, a housing coupled to the substrate and the pyrotechnic input, an ignition compound located in the housing and operationally coupled to the pyrotechnic input such that a combustion product of the exothermic chemical reaction of the pyrotechnic input ignites the ignition compound, and a solder thermally coupled to the ignition compound.

In various embodiments, the ignition compound may comprise a thermite. In various embodiments, the housing may be configured to output the solder onto the first conductive trace and the second conductive trace.

In various embodiments, a power supply may be electrically coupled to the first conductive trace. In various embodiments, a controller may be electrically coupled to the second conductive trace. The controller may be configured to receive a first electrical signal from the second conductive trace and output a second electrical signal a predetermined time delay after receiving the first electrical signal.

In various embodiments, a catapult driver may be configured to ignite a propulsion system of the ejection seat. The second electrical signal may be configured to deploy the catapult driver. f The foregoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the following illustrative figures. In the following figures, like reference numbers refer to similar elements and steps throughout the figures.

FIG. 3A illustrates an energy conversion system prior to ignition of an ignition compound of the energy conversion system, in accordance with various embodiments;

FIG. 3B illustrates the energy conversion system of FIG. 3A after ignition of the ignition compound, in accordance with various embodiments.

Figure 1:
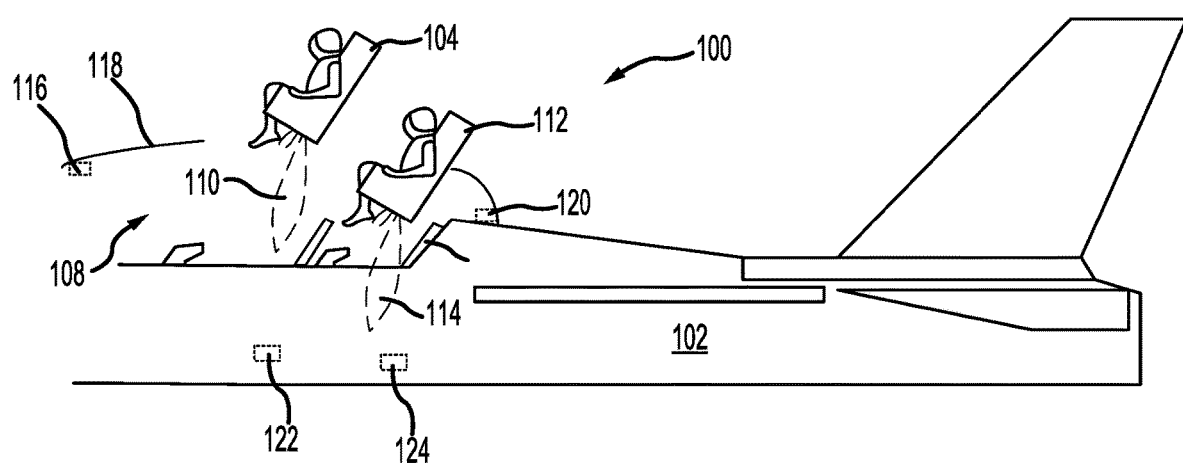
FIG. 1 illustrates ejection seats being launched from an aircraft cockpit, in accordance with various embodiments.

Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosures, it should be understood that other embodiments may be realized and that logical changes and adaptations in design and construction may be made in accordance with this disclosure and the teachings herein. Thus, the detailed description herein is presented for purposes of illustration only and not of limitation.

The scope of the disclosure is defined by the appended claims and their legal equivalents rather than by merely the examples described. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to tacked, attached, fixed, coupled, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts but not necessarily to denote the same or different materials.

The present disclosure provides an energy conversion system wherein a pyrotechnic signal is translated into an electronic signal by completing a circuit. In various embodiments, the energy conversion system is configured to melt a volume of solder onto a substrate, for example, a printed circuit board (PCB), upon initiation of ejection seat deployment. The solder is configured to complete or "close" a circuit on the substrate. The disclosed energy conversion system may be employed at the output or interface of a pyrotechnic device (e.g., a shock tube) and/or anywhere there is a desire to convert energy output from a pyrotechnic device into an electronical signal.

System program instructions and/or controller instructions may be loaded onto a tangible, non-transitory, computer-readable medium (also referred to herein as a tangible, non-transitory, memory) having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

With reference to FIG. 1, an ejection assembly 100 is shown. In accordance with various embodiments, ejection assembly 100 may be installed in an aircraft 102 to safely expel a first (or forward) ejection seat 104 from a cockpit 108 of aircraft 102. First ejection seat 104 may be urged from cockpit 108 by a first (or forward) propulsion system 110, also referred to as a forward seat catapult system. In various embodiments, ejection assembly 100 may also expel a second (or aft) ejection seat 112 from cockpit 108. Second ejection seat 112 may be urged from cockpit 108 by a second (or aft) propulsion system 114, also referred to as an aft seat catapult system.

Ejection assembly 100 may be configured to control the timing (i.e., sequence) of deploying various subsystems associated with expelling first ejection seat 104 and/or second ejection seat 112 from cockpit 108. For example, ejection assembly 100 may be configured to deploy one or more forward canopy driver(s) 116 configured to remove canopy 118 from over first ejection seat 104, one or more aft canopy driver(s) 120 configured to remove canopy 118 from over second ejection seat 112, one or more forward catapult driver(s) 122 configured to ignite propulsion system 110 and drive first ejection seat 104 out of cockpit 108, and/or one or more aft catapult driver(s) 124 configured to ignite propulsion system 114 and drive second ejection seat 112 out of cockpit 108. As described in further detail below, ejection assembly 100 may be configured to deploy each of forward canopy driver(s) 116, aft canopy driver(s) 120, forward catapult driver(s) 122, and/or aft catapult driver(s) 124 a predetermined time delay after the initiation of the ejection sequence. For example, ejection assembly 100 may be configured such that first ejection seat 104 will be expelled prior to second ejection seat 112 or vice versa. While ejection assembly 100 is described as controlling the ejection sequence for a forward ejection seat and an aft ejection seat aft, it is further contemplated that understood that ejection assembly 100 may include any number (one, three, four, etc.) of ejection seats, with the ejection seat(s) at any location (left, right, forward-left, aft-left, forward-right, etc.) in cockpit 108.

Figure 2:
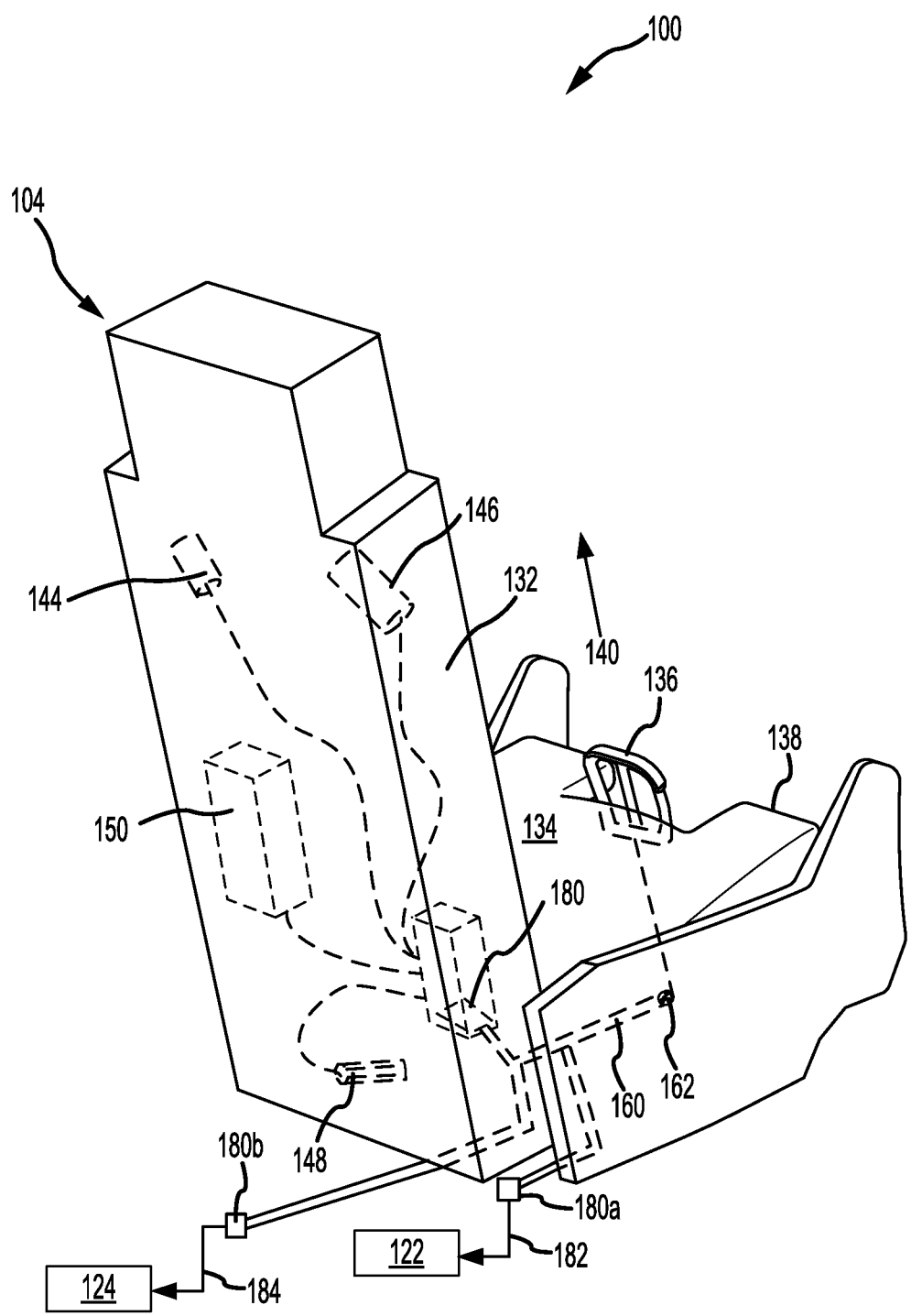
FIG. 2 illustrates a perspective view of an ejection seat, in accordance with various embodiments.

With reference to FIG. 2, first ejection seat 104 is illustrated, in accordance with various embodiments. While FIG. 2 describes features of first ejection seat 104, it is contemplated and understood that second ejection seat 112, with momentary reference to FIG. 1, may include the elements and functionalities as described herein with reference to first ejection seat 104.

First ejection seat 104 includes a seat back 132 and a seat pan 134. In various embodiments, an ejection handle 136 may be located, for example, proximate a front side 138 of seat pan 134. Front side 138 of seat pan 134 is generally opposite seat back 132. While FIG. 2 shows ejection handle 136 located at front side 138, it is further contemplated and understood that ejection handle 136 may be located anywhere that is accessible to an occupant of first ejection seat 104. Ejection handle 136 may be configured to initiate an ejection sequence upon actuation. For example, an occupant of ejection seat 104 pulling ejection handle 136 in the direction of arrow 140 may initiate the ejection sequence. The ejection sequence may also be initiated without actuation of ejection handle 136, for example, the ejection sequence may be initiated remotely, or in response to a particular flight condition (e.g., rapid change in altitude or velocity).

Ejection assembly 100 may be configured to control the timing (i.e., sequence) of deploying various subsystems of first ejection seat 104. For example, ejection assembly 100 may control deployment of drogue parachute mortar(s) 144, parachute mortar(s) 146, restraint release thruster(s) 148, rocket motor and stability package (STAPAC) 150, and/or other subsystems of first ejection seat 104. Ejection assembly 100 may be configured to deploy one or more of drogue parachute mortar(s) 144, parachute mortar(s) 146, restraint release thruster 148, and/or STAPAC 150 a predetermined time delay after initiation of the ejection sequence.

In accordance with various embodiments, initiation of the ejection sequence (e.g., actuation of ejection handle 136) may cause ignition of a pyrotechnic input 160. For example, in various embodiments, pyrotechnic input 160 may include a shock tube, a thin layer explosive, an ignition transfer line explosive, or any other pyrotechnic device configured undergo a combustion and/or exothermic chemical reaction in response to actuation of ejection handle 136. In various embodiments, actuation of ejection handle 136 may ignite an ignitor 162 of pyrotechnic input 160. For example, actuation of ejection handle 136 may cause a hammer or other actuator to strike a percussion primer containing a pressure-sensitive explosive. In response to the hammer striking the percussion primer, the explosive ignites or combusts (i.e., undergoes an exothermic reduction-oxidation reaction), sending a stream of hot gas (i.e., the product of the exothermic reduction-oxidation reaction) through pyrotechnic input 160. In various embodiments, a layer of energetic material may be located along an inner diameter of pyrotechnic input 160.

In accordance with various embodiments, pyrotechnic input 160 is operationally coupled to an energy conversion system 180. As described in further detail below, energy conversion system 180 is configured allow the energy produced by the combustion reaction of pyrotechnic input 160 to facilitate the output of an electrical signal. The electrical signal may initiate a time delay for deploying one of the ejection assembly 100 subsystems. For example, with combined reference to FIGS. 1 and 2, the electrical signal may be configured to cause a deployment of one or more of forward canopy driver(s) 116, aft canopy driver(s) 120, forward catapult driver(s) 122, aft catapult driver(s) 124, drogue parachute mortar(s) 144, parachute mortar(s) 146, restraint release thruster 148, and/or STAPAC 150. In various embodiments, ejection assembly 100 may include multiple energy conversion systems 180 with each energy conversion system 180 dedicated to a particular evacuation assembly subsystem. For example, a first energy conversion system 180a may facilitate an electrical signal 182 configured to control the timing for deploying forward catapult driver(s) 122 and a second energy conversion system 180b may facilitate an electrical signal 184 configured to control the timing for deploying aft catapult driver(s) 124. In various embodiments, first energy conversion system 180a and second energy conversion system 180b may be operationally coupled to pyrotechnic input 160. For example, in various embodiments, pyrotechnic input 160 may include multiple tubes or conduits configured deliver the combustion gas to multiple energy conversion systems 180. In various embodiments, each energy conversion system 180 may include a dedicated pyrotechnic input 160 configured to be ignited in response to initiation of the ejection sequence (e.g., in response to actuation of ejection handle 136).

With reference to FIG. 3A, an energy conversion system 180 is illustrated. Energy conversion system 180 includes a substrate 190. Substrate 190 is formed from one or more layers of insulating material such as a preimpregnated fiber reinforced composite (prepreg), for example, a glass-reinforced epoxy. In various embodiments, substrate 190 may comprise a printed circuit board (PCB). Substrate 190 may include one or more conductive traces such as first conductive trace 192 and second conductive trace 194. A first conductive pad or "land" 196 is electrically connected to first conductive trace 192. A second conductive pad or "land" 198 is electrically connected to second conductive trace 194. In FIG. 3A, first conductive trace 192 is electrically isolated from second conductive trace 194.

Energy conversion system 180 further includes an ignition compound 200 and a volume of solder 202. Ignition compound 200 and solder 202 may be located within a housing 204. Housing 204 may be coupled to pyrotechnic input 160 such that ignition compound 200 is located at an end 206 of pyrotechnic input 160. Ignition compound 200 is operationally and/or thermally coupled to pyrotechnic input 160 such that the combustion product (e.g., gas) G produced by ignition of pyrotechnic input 160 ignites ignition compound 200 (i.e., causes ignition compound 200 to undergo an exothermic reduction-oxidation reaction). Ignition compound 200 may comprise a thermite. For example, ignition compound 200 may comprise a mixture of a metal (e.g., one or more of aluminum, magnesium, titanium, boron, zirconium) and a metal oxide (e.g., one or more of copper oxide, iron oxide, boron oxide, manganese oxide, lead oxide). In various embodiments, ignition compound 200 is a mixture of aluminum and copper oxide. Ignition compound 200 is thermally coupled to solder 202. The ignition of ignition compound 200 (i.e., the energy produced by the exothermic reduction-oxidation reaction) is configured to melt solder 202.

FIG. 3B illustrates energy conversion system 180 after ignition of ignition compound 200 in FIG. 3A. Ignition of ignition compound 200 melts solder 202. Melted solder 202 exits housing 204 through an orifice 210 in housing 204. The volume of solder 202 and the location of orifice 210 and housing 204 over substrate 190 are selected such that melted solder 202 will contact first pad 196 and second pad 198. For example, housing 204 may be coupled to substrate 190 with orifice 210 oriented generally towards first pad 196 and second pad 198. The volume of solder 202 is selected such that solder 202 will extend continuously from first pad 196 to second pad 198 such that solder 202 electrically connects first conductive trace 192 and second conductive trace 194. Solder 202 electrically connecting first conductive trace 192 and second conductive trace 194 may allow electrical signals to travel from first conductive trace 192 to second conductive trace 194. In this regard, solder 202 may "close" a circuit formed by first conductive trace 192 and second conductive trace 194.

Figure 4:
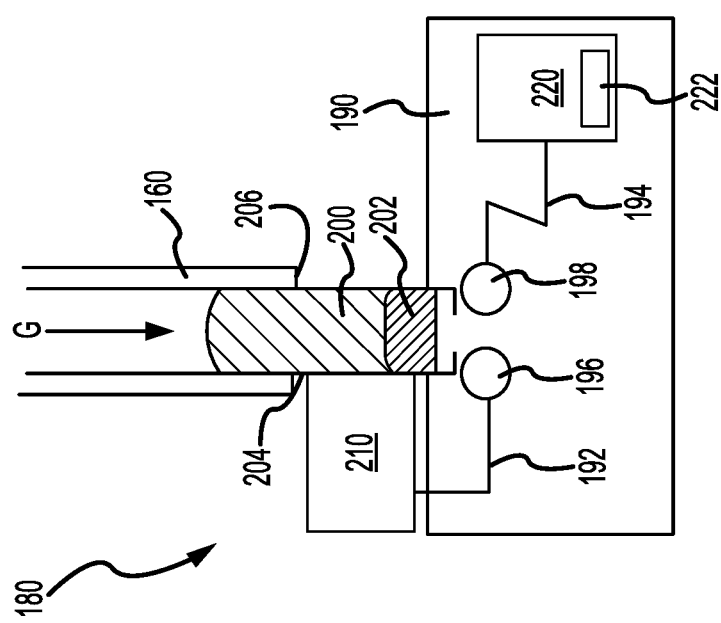
FIG. 4 illustrates a power supply thermally coupled to an ignition compound of an energy conversion system, in accordance with various embodiments.

A power supply 210 may be electrically connected to first conductive trace 192. In various embodiments, power supply 210 may be located on substrate 190. In various embodiments, power supply 210 may be separate from substrate 190. Power supply 210 may comprise a thermal battery, a lithium battery, a Peltier generator, or any other power supply capable supplying a current to first conductive trace 192. In various embodiments, power supply 210 may be activated in response to initiation of the ejection sequence. For example, power supply 210 may be operationally coupled to ejection handle 136, with momentary reference to FIG. 2. Actuation of ejection handle 136 may activate power supply 210. Upon activation, power supply 210 supplies current to first conductive trace 192. In various embodiments, power supply 210 may be thermally activated. With momentary reference to FIG. 4, in various embodiments, power supply 210 may be thermally coupled to ignition compound 200 such that ignition of ignition compound 200 activates power supply 210. Stated differently, power supply 210 may be configured to activate and begin outputting current to first conductive trace 192 in response to ignition of ignition compound 200.

Returning to FIG. 3B, in various embodiments, second conductive trace 194 is electrically coupled to a controller 220. Controller 220 may include and communicate with one or more processor(s) and one or more tangible, non-transitory memory(ies) 222 and may be capable of implementing logic. The processor can be a general purpose processor, a digital signal processor (DSP), an application specific integrated circuits (ASIC), a field programmable gate arrays (FPGAs) or other programmable logic device, discrete gates or transistor logic, discrete hardware component, or a combination thereof. In various embodiments, controller 220 may be located on substrate 190. In various embodiments, controller 220 may be separate from substrate 190. Controller 220 may be configured to output an electrical signal 224 in response to receiving an electrical signal from second conductive trace 194. Controller 220 may output electrical signal 224 a predetermined time delay after receiving the electrical signal from second conductive trace 194. Electrical signal 224 may cause deployment of one or more of the ejection assembly subsystems (e.g., deployment of forward canopy driver(s) 116, aft canopy driver(s) 120, forward catapult driver(s) 122, and/or aft catapult driver(s) 124 in FIG. 1). In this regard, energy conversion system 180 is configured to use the energy generated by the ignition of pyrotechnic input 160 to electrically connect first conductive trace 192 and second conductive trace 194, and thereby cause electrical signal 224 to be output a predetermined time delay after ignition of pyrotechnic input 160.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosures. The scope of the disclosures is accordingly to be limited by nothing other than the appended claims and their legal equivalents, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is intended to invoke 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An energy conversion system, comprising:
   a substrate including a first conductive trace and a second conductive trace electrically isolated from the first conductive trace;
   a housing coupled to the substrate;
   an ignition compound located in the housing; and
   a solder located in the housing.

2. The energy conversion system of claim 1, wherein the ignition compound comprises a thermite.

3. The energy conversion system of claim 2, wherein the solder is thermally coupled to the ignition compound such that ignition of the ignition compound melts the solder, and wherein the housing is configured to output the solder onto the first conductive trace and the second conductive trace.

4. The energy conversion system of claim 3, wherein an orifice in the housing is oriented toward the first conductive trace and the second conductive trace.

5. The energy conversion system of claim 4, further comprising:
   a first conductive pad electrically coupled to the first conductive trace; and
   a second conductive pad electrically coupled to the second conductive trace, wherein the orifice in the housing is oriented toward the first conductive pad and the second conductive pad.

6. The energy conversion system of claim 2, further comprising a power supply electrically coupled to the first conductive trace.

7. The energy conversion system of claim 6, wherein the power supply is thermally coupled to the ignition compound.

8. An assembly, comprising:

a pyrotechnic input configured to undergo an exothermic chemical reaction; and an energy conversion system operationally coupled to the pyrotechnic input, the energy conversion system comprising:

a substrate including a first conductive trace and a second conductive trace electrically isolated from the first conductive trace;

a housing coupled to the substrate and the pyrotechnic input;

an ignition compound located in the housing and operationally coupled to the pyrotechnic input such that a combustion product of the exothermic chemical reaction of the pyrotechnic input ignites the ignition compound; and a solder thermally coupled to the ignition compound.

9. The assembly of claim 8, wherein the ignition compound comprises a thermite.

10. The assembly of claim 9, wherein the solder is thermally coupled to the ignition compound such that ignition of the ignition compound melts the solder, and wherein the housing is configured to output the solder onto the first conductive trace and the second conductive trace.

11. The assembly of claim 10, further comprising an actuator configured to initiate the exothermic chemical reaction of the pyrotechnic input.

12. The assembly of claim 8, further comprising a power supply electrically coupled to the first conductive trace.

13. The assembly of claim 12, wherein the power supply is thermally coupled to the ignition compound.

14. The assembly of claim 12, further comprising a controller electrically coupled to the second conductive trace, wherein the controller is configured to receive a first electrical signal from the second conductive trace and output a second electrical signal a predetermined time delay after receiving the first electrical signal.

15. An ejection assembly, comprising:

an ejection seat;

an ejection handle configured to initiate an ejection sequence for the ejection seat in response to an actuation of the ejection handle;

a pyrotechnic input operationally coupled to the ejection handle, wherein the actuation of the ejection handle is configured initiate an exothermic chemical reaction within the pyrotechnic input; and an energy conversion system operationally coupled to the pyrotechnic input, the energy conversion system comprising:

a substrate including a first conductive trace and a second conductive trace electrically isolated from the first conductive trace;

a housing coupled to the substrate and the pyrotechnic input;

an ignition compound located in the housing and operationally coupled to the pyrotechnic input such that a combustion product of the exothermic chemical reaction of the pyrotechnic input ignites the ignition compound; and a solder thermally coupled to the ignition compound.

16. The ejection assembly of claim 15, wherein the ignition compound comprises a thermite.

17. The ejection assembly of claim 16, wherein the housing is configured to output the solder onto the first conductive trace and the second conductive trace.

18. The ejection assembly of claim 17, further comprising a power supply electrically coupled to the first conductive trace.

19. The ejection assembly of claim 18, further comprising a controller electrically coupled to the second conductive trace, wherein the controller is configured to receive a first electrical signal from the second conductive trace and output a second electrical signal a predetermined time delay after receiving the first electrical signal.

20. The ejection assembly of claim 19, further comprising a catapult driver configured to ignite a propulsion system of the ejection seat, wherein the second electrical signal is configured to deploy the catapult driver.

\* \* \* \* \*